United States Patent [19]

Schroeder et al.

[11] 4,227,158
[45] Oct. 7, 1980

[54] MULTIFREQUENCY CONTROL FROM A SINGLE CRYSTAL

[75] Inventors: George F. Schroeder, Wayne; Lincoln S. Ferriss, Lincoln Park, both of N.J.

[73] Assignee: The Singer Company, Little Falls, N.J.

[21] Appl. No.: 8,459

[22] Filed: Feb. 1, 1979

[51] Int. Cl.³ .......................................... H03L 7/02
[52] U.S. Cl. .............................................. 331/2; 331/4;
    331/19; 331/25; 331/69; 331/158; 331/183
[58] Field of Search .................... 331/2, 4, 18, 19, 25,
    331/158, 159, 69, 183, 9

[56] References Cited
U.S. PATENT DOCUMENTS

| | | | |
|---|---|---|---|
| 2,478,330 | 8/1949 | Shonnard | 331/156 |
| 3,147,448 | 9/1964 | Orlando | 331/4 |
| 3,743,960 | 7/1973 | Steudel | 331/18 X |
| 3,962,652 | 6/1976 | Zarin et al. | 331/25 X |
| 3,979,698 | 9/1976 | Gollinger | 331/116 FE |

FOREIGN PATENT DOCUMENTS 2815434  10/1978  Fed. Rep. of Germany ............ 331/25

Primary Examiner—Siegfried H. Grimm
Attorney, Agent, or Firm—John C. Altmiller; T. W. Kennedy

[57] ABSTRACT

A piezo-electric crystal vibrating in several modes controls several frequencies generated by voltage controlled oscillators simultaneously. The output of each voltage controlled oscillator is fed to a summing amplifier which drives the crystal. The output of the crystal is fed to individual phase detectors; each phase detector is also supplied with the output of a voltage controlled oscillator and generates a voltage proportional to the phase difference between the voltage controlled oscillator and the crystal output for correcting the output frequency of each oscillator.

7 Claims, 5 Drawing Figures

MULTIFREQUENCY CONTROL FROM A SINGLE CRYSTAL

BACKGROUND OF THE INVENTION

This invention relates to a circuit for using a piezoelectric crystal, or any other type of electromechanical resonator capable of vibrating in several different modes, as the stable frequency reference element in an oscillator circuit. More particularly, the output of one or more voltage controlled oscillators is used to drive the crystal and the output frequencies passed by the crystal are supplied to a corresponding number of phase detectors. Each phase detector is also supplied with the output of a voltage controlled oscillator and generates a DC voltage which is proportional to the phase difference between the output voltage of the voltage controlled oscillator and the output of the crystal, the proportional voltage being used to bring the frequency of the voltage controlled oscillator onto the crystal frequency.

It is a familiar fact that a piezo-electric crystal can be used in different resonant modes as the frequency determining element in an oscillator circuit. Also, a single crystal vibrating in several modes can be used to generate several frequencies simultaneously.

The typical classical, single frequency, crystal controlled oscillator may have an amplifier feeding its output back to its input through a filter network. The amplifier must have a broad bandwidth in order to have good phase stability and is provided with automatic gain control for regulating the amplitude of oscillation. The automatic gain control circuit, in combination with the network, is used to shape the gain and phase in such a way that oscillation occurs at only one frequency. A major source of error of the oscillator frequency is lack of phase stability in the amplifier and the network; any change in phase results in movement of the crystal off of resonance to compensate for it.

When the oscillator circuit just described is used to generate multiple frequencies, individual amplifiers and compensating networks must be provided in parallel loops between the crystal output and input in order to control the gain for each frequency. Since the Q of the crystal is different for each resonant frequency, the required gain in each path is different. There are difficulties with the implementation of this type of circuit. The various filters required for each frequency must be relatively sharp in order to separate the frequencies; such filters tend to produce large phase changes in response to minor variations in component parameters. Any phase change produced by the filters will result in unacceptably large changes in crystal operating point to compensate for the change. This circuit is also deficient in that frequency instability can result from interaction between the controls, particularly when the frequencies are not sufficiently separated. Thus, leakage of a signal at one frequency may occur through the filter for another frequency, and vice versa, and, since the signals will be considerably shifted in phase, each affected crystal mode will be required to move further off resonance to compensate.

BRIEF DESCRIPTION OF THE INVENTION

These problems and others which will become apparent from a reading of the following specification are solved in this invention by using the crystal as a reference to regulate or control the output frequency of one or more separate oscillators. Thus, a voltage controlled oscillator is provided for each desired output frequency and the output of the oscillator is compared in a phase detector with the output of the crystal as it resonates in a particular mode at the desired frequency. When several frequencies are being generated, the outputs of the voltage controlled oscillators are combined in a summing amplifier whose output is fed to the crystal.

The output of the crystal is fed to a buffer amplifier having a low input impedance which is connected in series with the crystal; it has a current to voltage gain for supplying the signals from the crystal to the phase detector. The phase detector compares these signals with a reference signal fed back to it from the voltage controlled oscillator. The phase detector output is a direct current (DC) voltage which is proportional to the phase difference between the output of the voltage controlled oscillator and the output of the crystal; this proportional voltage is fed to the oscillator control circuit and locks it onto frequency. The phase detector output also contains high frequencies. It is therefore preferred to pass the signal through a low pass filter, which also serves to stabilize the electronic servo, and through an integrating circuit so that the accumulated DC output of the filter will cause the oscillator to move in the direction of reducing the DC output of the phase detector to zero, thus matching the frequency of the voltage controlled oscillator to the frequency of the crystal.

This mechanism can be used to control many voltage controlled oscillators since the system is essentially linear and there is no interaction between its branches. The advantages are several. In each phase locked loop the DC voltage has been produced by the phase detector for only the proper input frequency. Thus, each frequency chosen is used to provide a control for the appropriate voltage controlled oscillator. Because the filter operates on the phase locked loop system error voltage, its phase characteristics will not produce frequency errors like those produced by filters in circuits which directly affect the frequency output of the crystal. Also, with the phase locked loop servo system, dynamic networks can be introduced to modify the response of the voltage controlled oscillator to changes in the crystal resonance. So, too, phase modulation can be introduced by adding a signal to the direct current before the voltage controlled oscillator. Since the phase locked loop is itself not an oscillator but rather is a regulator of an oscillator, amplitude control of the kind sometimes found in crystal systems is not required. Control of oscillation amplitude may be part of the voltage controlled oscillator itself (depending upon the precision of frequency control required). Voltage or current levels in the crystal may be controlled by the gain of the summing amplifier or controlling the output of the voltage controlled oscillator.

In a further feature of the invention, means are provided for starting the system, since the voltage controlled oscillator must initially come within the frequency range of the phase detection system before it can lock on. Thus, an RC circuit is provided which has a time constant longer than the response time of the phase locked loop and by means of which a direct current starting voltage may be supplied to the voltage controlled oscillator. When voltage is first applied to the oscillator control, the rising voltage produced by the RC network results in a sweeping frequency output, in effect searching the crystal for the resonant point so that the phase locked loop can take over.

BRIEF DESCRIPTION OF THE INVENTION

Figure 1:
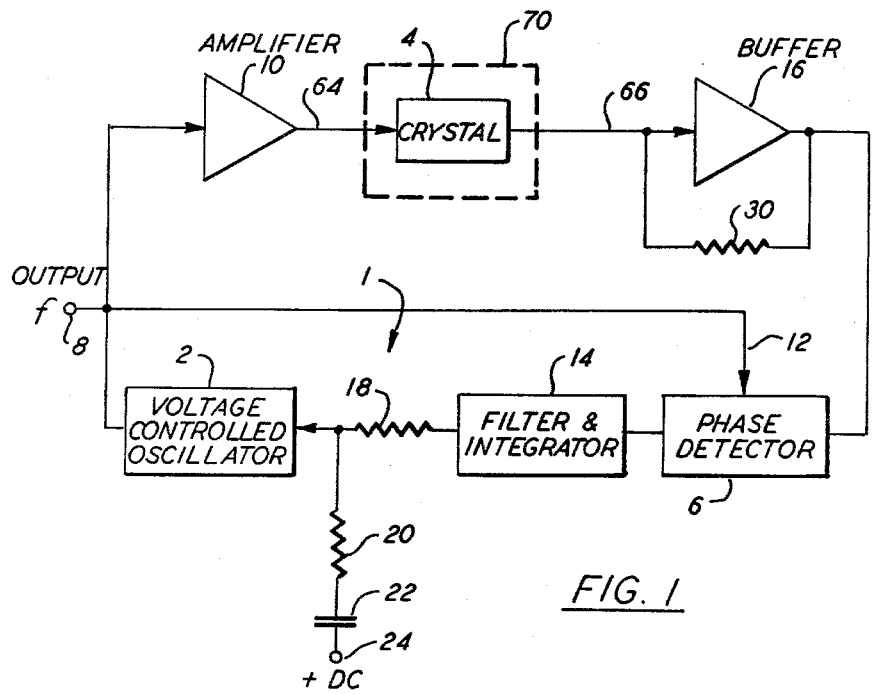
FIG. 1 is a block diagram of a single voltage controlled oscillator controlled by a crystal in accordance with the teachings of the invention.
Figure 2:
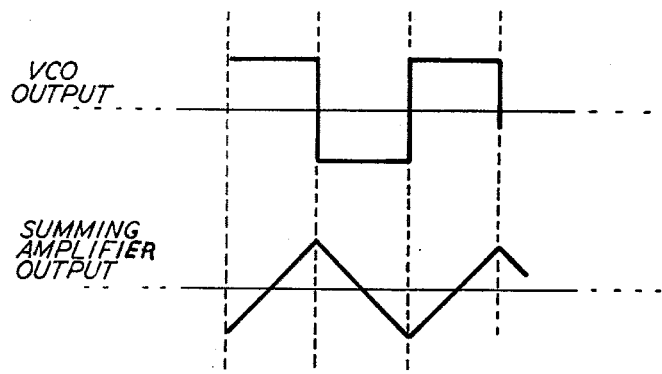
FIG. 2 is a graphical representation of two wave forms occurring in the circuit of FIG. 1.

Reference is now made to FIG. 1 which shows a phase locked loop 1 containing a voltage controlled oscillator 2, a filter 14, and a phase detector 6. The output of voltage controlled oscillator 2 is made available at output terminal 8 for use in external circuitry; it is also connected to the input of amplifier 10 and to the reference input 12 of phase detector 6. Voltage controlled oscillator 2 has an output as shown in FIG. 2, having a frequency which is proportional to a DC control voltage supplied to filter 14 from phase detector 6. Crystal 4 is connected in series between amplifier 10 and buffer amplifier 16. Amplifier 10 is preferably an integrating amplifier capable of producing a 90° phase shift between its input and output signals. FIG. 2 shows the triangular wave form which results from integration, as well as the 90° phase shift needed to produce maximum control sensitivity in the system.

Buffer amplifier 16 is used as a transimpedance amplifier and has a low input resistance. The amplifier input, taken in conjunction with feedback resistor 30, is a virtual ground. The effect of amplifier 16 is to convert the input current to an output voltage at an impedance level appropriate to the input of phase detector 6. Phase detector 6, supplied with the crystal output at one input and with the signal from voltage controlled oscillator 2 at its reference input, produces DC voltage at its output as well as many high frequencies. The DC voltage is proportional to the difference in phase between the two input signals. The phase detector will only make DC when the input frequency is the same as, or is an odd harmonic of, the reference frequency. Also, maximum control sensitivity is achieved because the 90° phase shift introduced into the system by amplifier 10 assures that the phase detector null will occur at the series resonant point of the crystal. The resistive component of the resonant current is rejected and plus or minus DC is made from the reactive currents, yielding an output signal proportioned to the resonance error.

The output of phase detector 6 is fed through filter 14 and filter output resistor 18 to the input of voltage controlled oscillator 2. A start-up voltage for voltage controlled oscillator 2 is also applied to the input of oscillator 2 via series connected resistor 20 and capacitor 22 from a conventional DC supply connected to terminal 24.

The frequency range over which the voltage controlled oscillator will oscillate may be preset by appropriate circuit design; because of the limited dynamic range over which these oscillators operate, a particular voltage controlled oscillator can be pretrimmed to work between given frequency limits. The function of the low pass filter 14 is to remove extraneous products of demodulation generated by the phase detector, passing essentially direct current signals to the voltage controlled oscillator. The band-width of the filter is determined by the desired speed of response for maintaining the voltage control oscillator locked onto the crystal. Also included in filter 14 may be any necessary stabilizing networks and an integrator for summing the incremental DC outputs of the phase detector for use in causing the voltage controlled oscillator to bring the DC output of the phase detector to zero, as will be understood by those skilled in the art.

In operation, the voltage controlled oscillator must initially come on to the frequency range of the phase detection system in order for lock-on to occur. This is accomplished when voltage is applied to the system by applying an initial DC voltage swing to the oscillator control input by means of start-up circuit capacitor 22 and resistance 20. The application of voltage to terminal 24 starts the flow of charging current in capacitor 22 and results in application of a changing voltage to the voltage control terminal of oscillator 2 which disappears when the capacitance is fully charged. The oscillator is thus swept once through its range to pick up the crystal resonance. Then voltage fed through the phase locked loop becomes the controlling factor as will be described.

The output of oscillator 2 is fed through amplifier 10 to crystal 4 which is driven into resonance. An alternating current output at the resonant frequency of the crystal is supplied to buffer amplifier 16. The output of buffer amplifier 16 is applied to phase detector 6 where it is compared with the output of the voltage controlled oscillator and produces an error voltage. The error voltage is supplied through filter 14 and summing resistance 18 to the input of the voltage controlled oscillator. Because of the 90° phase difference introduced into the system by amplifier 10, the DC output of phase detector 6 will be zero when the outputs of voltage controlled oscillator 2 and crystal 4 have 90° phase difference. Deviation of voltage controlled oscillator 2 from the resonant frequency of crystal 4 results in production of an error signal at the output of phase detector 6 having a polarity and magnitude appropriate to correcting the error when applied to the control input of oscillator 2.

The circuit just described has the character of a very selective tracking filter. Therefore it has particular merit in oscillators where there is need to suppress unwanted crystal modes.

Figure 3:
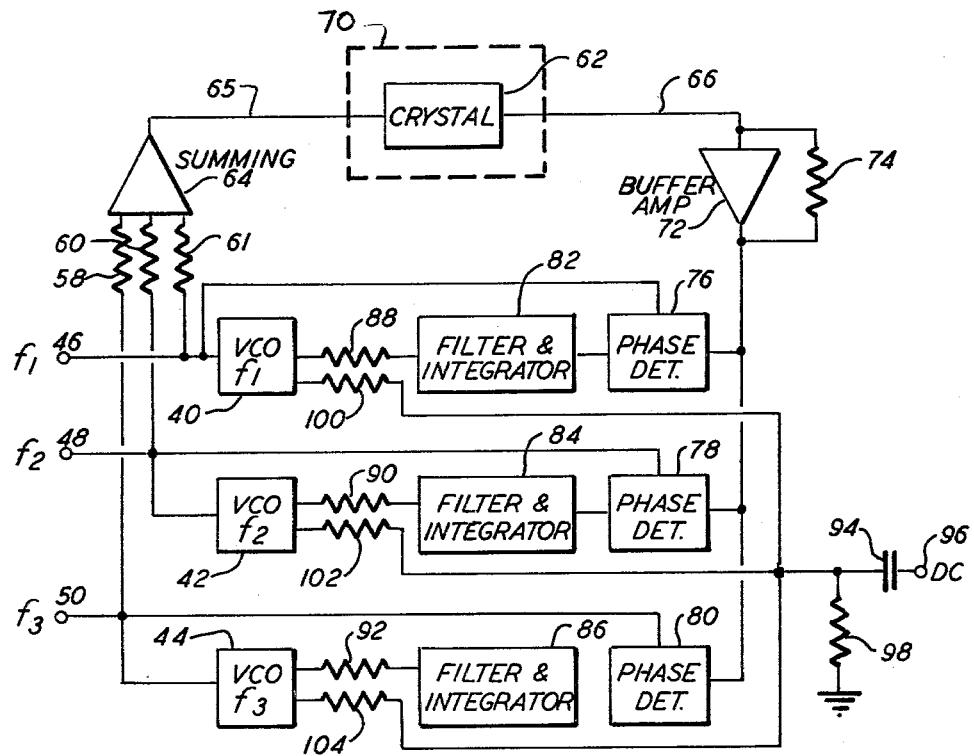
FIG. 3 is a partially schematic block diagram showing the use of a single crystal to control three voltage controlled oscillators.

FIG. 3 illustrates one way in which this circuit can be utilized in a system where a single resonator is used in a linear system to control the outputs of many voltage controlled oscillators without interaction between the oscillators.

The system of FIG. 3 has three voltage controlled oscillators 40, 42 and 44 whose output frequencies $f_1$, $f_2$, and $f_3$ are respectively connected to output terminals 46, 48 and 50, to the reference inputs of phase detectors 76, 78 and 80 and through summing resistors 61, 60, and 58, to summing amplifier 64. As was the case with the amplifier 10 of FIG. 1, summing amplifier 64, in addition to adding the input signals f1, f2, and f3 of the voltage controlled oscillators, also conveniently introduces the necessary 90° phase shift in the oscillator output signals needed to produce proper phase detector action. The output of summing amplifier 64 is connected to one terminal of crystal 62. As will be understood by those skilled in the art, crystal 62 may be maintained in an oven 70, shown schematically in FIG. 3 by dashed lines, to minimize drift in its resonant frequencies due to temperature change. The other terminal of crystal 62 is connected to buffer amplifier 72. As described above in connection with FIG. 1, amplifier 72, together with its shunt feedback resistance 74, functions to provide a ground for crystal 62 and to supply input voltages to phase detectors 76, 78 and 80. As was the case in FIG. 1, each phase detector produces a DC voltage output which is proportional to the phase difference between the voltage controlled oscillator output frequency and the input received from the crystal. The outputs of the phase detectors 76, 78, and 80 are connected through filter networks 82, 84, and 86 and summing resistors 88, 90, and 92 to the voltage control inputs of voltage controlled oscillators 40, 42, and 44, respectively.

The output of buffer amplifier 72 is the sum of all the frequencies passed by the crystal as it vibrates in each mode. In each phase-locked loop, direct current voltage is generated by each phase detector for only one input frequency component, since the phase detectors, which may be balanced demodulators, will only produce DC output when both frequencies equal to each other. Thus each frequency control system is immune to disturbance from other frequencies occurring in the system as a whole. And each frequency of interest is, in effect, selectively transformed to provide a control for the appropriate voltage controlled oscillator. To assure this action, the crystal modes and the corresponding oscillator frequencies should be chosen so that they are not odd harmonics of each other. The purpose of the filters 82, 84 and 86 is, as was the case in FIG. 1, to remove noise and ripple generated in the phase detection process from the DC voltage output of the phase detectors being fed to the voltage controlled oscillators. If desired, signal modification techniques may be used to modify the input to the voltage controlled oscillators for altering their responses to changes in the crystal resonance, as will be understood by those skilled in the art. Similarly, phase modulation or frequency modulation can be accomplished by adding a signal to the direct current supplied to the voltage controlled oscillator.

An arrangement like that of FIG. 1 provides for start-up of the oscillators; here, capacitance 94 is charged by a DC voltage applied to terminal 96, the charging current flowing through resistance 98 to ground, and the changing voltage appearing across resistor 98 is applied to the voltage controlled oscillators through the respective summing resistors 100, 102, and 104. They are thus swept through the frequency range needed to excite the desired crystal resonances.

Figure 4:
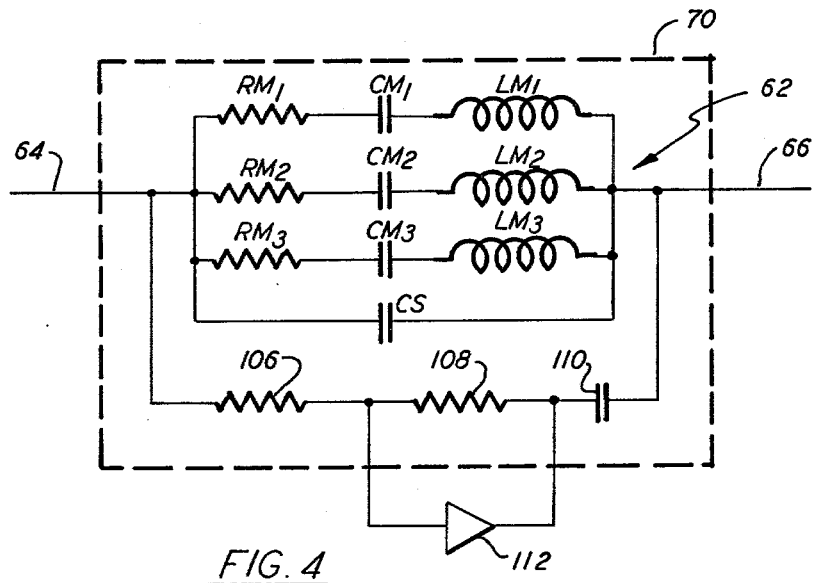
FIG. 4 is a schematic diagram of the crystal element of FIG. 3 showing a circuit for compensating for shunt capacitance in accordance with the teachings of the invention.

FIG. 4 shows a circuit which is particularly useful in either the circuit of FIG. 1 or that of FIG. 3 for negating the undesirable effects of shunt capacitance current flowing in crystals of poor quality, if such are to be employed. For this purpose, the circuit of FIG. 4 may be connected in these circuits via lines 64 and 66. In FIG. 4, the crystal 62 is shown contained in an oven 70 to minimize frequency drift. For the purpose of illustration, crystal 62 is shown here in equivalent circuit form.

A voltage dividing network consisting of series connected resistors 106 and 108 and capacitance 110 is placed across the terminals of crystal 62. Precision inverting amplifier 112 is connected in parallel with resistor 108 and functions together with capacitor 110 to produce a current which is equal, but opposite, to that flowing through the shunt capacitance $C_S$ of the crystal. If the compensating capacitance 110 is made of the same material as the crystal (or part of the crystal) and it and the gain controlling resistors are placed in the crystal oven, the compensation can be maintained with great precision. The amplitude of the compensating current can be set by varying the ratio of resistors 106 and 108, as will be understood by those skilled in the art. By choosing the temperature coefficients of these resistors properly, temperature compensation of the crystal, its shunt capacitance, and of the compensatingcapacitance can also be achieved. In this way, the effect of variations in the motional resistances $Rm1$, $Rm2$ and $Rm3$ is significantly reduced, and variations in the motional resistances will primarily affect the gain of the phase locked loop. With proper shunt capacitive compensation, gain variations in the entire loop will not produce frequency variations.

A degree of control of voltage or current levels of the various crystal modes may be exercised by varying the gain of the summing amplifier or the output level of a given voltage controlled oscillator. If a more precise control of the voltage applied to the crystal is desired beyond that provided by the voltage control oscillator itself, an automatic voltage control amplifier can be introduced between the voltage controlled oscillator and the summing amplifier input. If heating of the crystal is to be controlled, the voltage control amplifier can take the form of a precise voltage regulator; if only one amplifier is desired, such an automatic voltage controlling amplifier may be placed after the summing amplifier for controlling the RMS value of the complex applied voltage.

Figure 5:
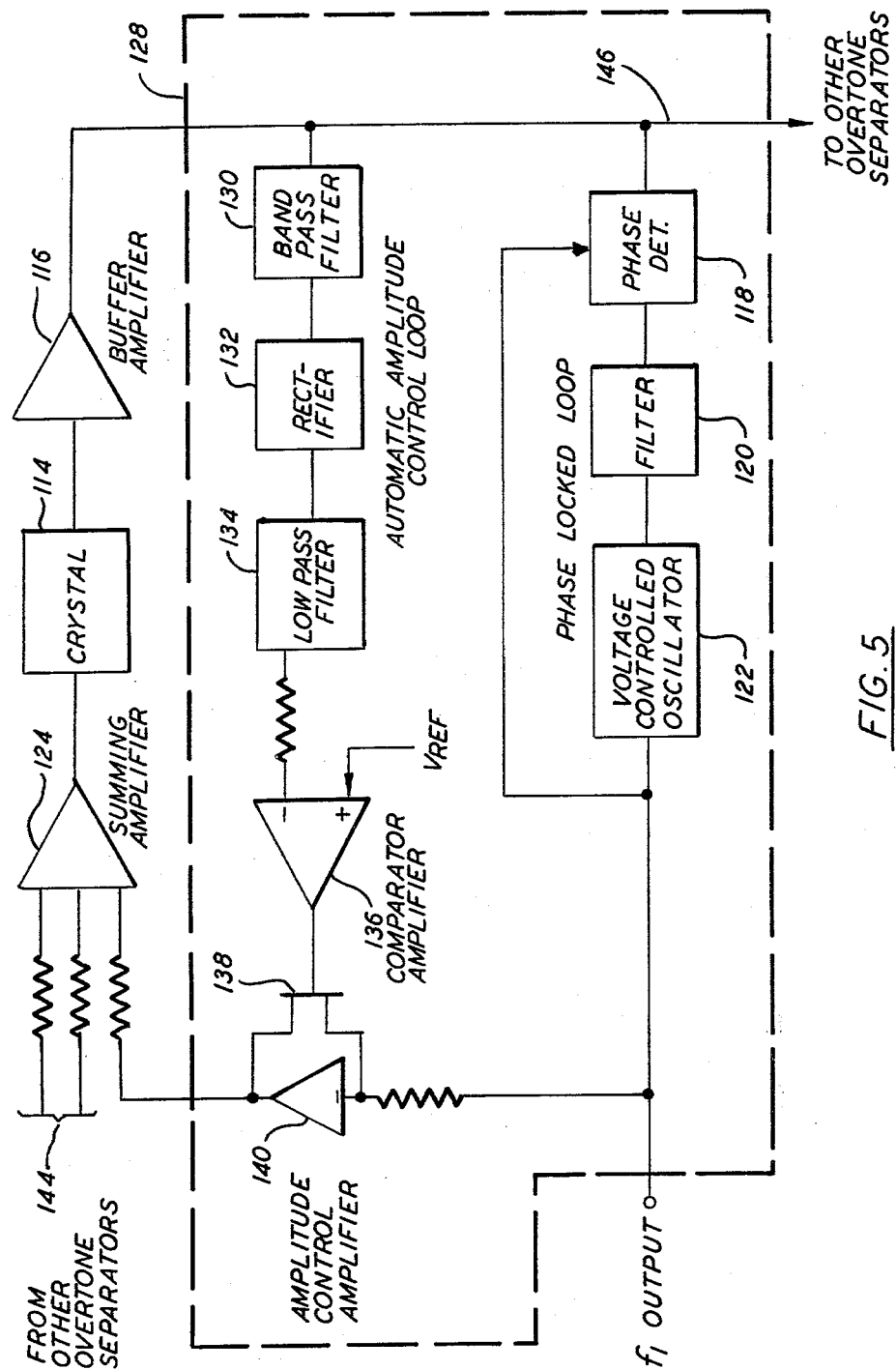
FIG. 5 is a block diagram illustrating an overtone separator assembled in accordance with the teachings of the invention.

The circuit of FIG. 5 shows how amplitude control of one of several crystal frequencies is accomplished by the insertion of an amplitude control amplifier 140 between the output of the voltage controlled oscillator 122 and the input of the summing amplifier 124 of FIGS. 1 and 3. Amplitude control of particular frequencies is desirable, for example, where particular modes of oscillation require different drive levels. Vibrating crystal 114, buffer amplifier 116 and summing amplifier 124 are the same as shown in FIGS. 1 and 3; summing amplifier 124 is configured as an integrator and provides the 90° phase difference between phase detector inputs which produces crystal excitation at its series resonant frequencies. One channel of the frequency control 128 is shown in FIG. 5, being enclosed within dotted lines. Phase detector 118, filter 120 and voltage controlled oscillator 122 constitute the frequency tracking filter elements of one frequency control channel. Additional elements for producing automatic amplitude control include band pass filter 130, which is broadly tuned to the frequency controlled by this channel, followed by rectifier 132, low pass filter 134, and comparator amplifier 136. The control signal generated by comparator amplifier 136 in response to the output signal from buffer amplifier 116 at the frequency of control of the channel 128 is fed to the gate terminal of a field effect transistor 138 in the feedback path of amplitude control amplifier 140. Changes in the control signal at the gate terminal produce changes in the resistance of field effect transistor 138 which, taken in conjunction with amplifier 140, serves to vary the gain of amplifier 140 as will be understood by those skilled in the art.

For the purposes of simplification, other, parallel, multifrequency control loops have been omitted. It will be understood by those skilled in the art that inputs for other such overtone separators may be taken off as shown in FIG. 5 at the output of buffer amplifier 116 (output line 146) and that the outputs of such loops would be connected to input lines 144 of summing amplifier 124.

The invention has been illustrated in embodiments for controlling either one or three separate frequencies by one crystal. It will be understood by those skilled in the art that the basic concept can be used for controlling as many frequencies as are required and can conveniently be produced by a given crystal. It will also be apparent to those skilled in the art that wide latitude exists for variation in assembling such control systems without departing from the teachings of the invention. The below appended claims should therefore be interpreted in keeping with the spirit of the invention, rather than limited to the specific form taken by the illustrative embodiments.

What is claimed is:

1. A circuit for regulating the output frequencies of a number of voltage controlled oscillators including a crystal capable of simultaneous vibration in more than one mode at different frequencies, the crystal being connected between the output of a summing amplifier and the input of a buffer amplifier, a number of voltage controlled oscillators each being supplied with a variable DC voltage for controlling its frequency, the outputs of the voltage controlled oscillators being supplied to the summing amplifier, and a phase detector associated with each oscillator for receiving the output of each voltage controlled oscillator and the output of the buffer amplifier for the purpose of generating a DC voltage proportional to the phase difference between the output of the oscillator and the buffer amplifier and supplying it to the associated oscillator to control its frequency.

2. The circuit of claim 1 in which a filter and integrator is connected between each phase detector and each voltage controlled oscillator for causing the direct current output of the phase detector to be brought to zero.

3. The circuit of claim 1 in which the circuit connecting the voltage controlled oscillator, the crystal, and the phase detector includes means for introducing a 90° phase shift in the transmitted signal.

4. The circuit of claim 1 including means responsive to the output of the crystal at a given frequency for controlling the amplitude of the signal driving the crystal at that frequency.

5. The circuit of claim 1 in which means are provided for sweeping the frequency of at least one of the voltage controlled oscillators to the crystal resonant point.

6. The circuit of claim 5 in which the frequency sweeping means includes an RC circuit for varying the DC voltage applied to the oscillator.

7. The circuit of claim 1 in which a filter is connected between each phase detector and its associated voltage controlled oscillator for causing the direct current output of the phase detector to be brought to zero, the summing amplifier includes means for introducing a 90° phase shift into the transmitted signal, and means are provided for sweeping the frequency of at least one of the voltage controlled oscillators to find the resonant point of the crystal.

* * * * *